US012610479B2

(12) United States Patent
Yang et al.

(10) Patent No.: US 12,610,479 B2
(45) Date of Patent: Apr. 21, 2026

(54) PORTABLE ELECTRONIC DEVICE

(71) Applicant: LG ELECTRONICS INC., Seoul (KR)

(72) Inventors: Hyunsuk Yang, Seoul (KR); Yongjin Hwang, Seoul (KR); Donghyok Shin, Seoul (KR); Peelhyuk Lim, Seoul (KR); Bongjun Jae, Seoul (KR); Byeongduk An, Seoul (KR); Dongjoon Choi, Seoul (KR); Laio Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 74 days.

(21) Appl. No.: 18/519,886

(22) Filed: Nov. 27, 2023

(65) Prior Publication Data

US 2024/0224444 A1     Jul. 4, 2024

(30) Foreign Application Priority Data

Dec. 28, 2022   (KR) ......................... 10-2022-0187774
Jul. 14, 2023   (KR) ......................... 10-2023-0091994

(51) Int. Cl.
H05K 5/02        (2006.01)
G06F 1/16        (2006.01)
H05K 5/00        (2025.01)
(52) U.S. Cl.
CPC ......... H05K 5/0217 (2013.01); G06F 1/1643 (2013.01); G06F 1/1652 (2013.01); H05K 5/0086 (2013.01)

(58) Field of Classification Search
CPC .... G06F 1/1626; G06F 1/1643; G06F 1/1652; G06F 1/1656; H05K 5/0086; H05K 5/0217; H05K 1/028; H05K 1/118; H05K 1/147; H05K 1/189; H05K 2201/05; H05K 2201/0707
See application file for complete search history.

(56) References Cited

U.S. PATENT DOCUMENTS

2016/0323428 A1*  11/2016  Kim ...................... G06F 1/1626
2019/0384091 A1*  12/2019  Li .......................... H10K 77/111
2020/0192431 A1*   6/2020  Shin ...................... G06F 1/1626
2021/0074789 A1*   3/2021  Hwang ................. H10K 59/126

(Continued)

*Primary Examiner* — Nitin Patel
*Assistant Examiner* — Amen W Bogale
(74) *Attorney, Agent, or Firm* — Birch, Stewart, Kolasch & Birch, LLP

(57) ABSTRACT

Disclosed is a portable electronic device including a flexible display, a shutter frame arranged on a back surface of the flexible display, a middle frame arranged on a back surface of the shutter frame, a sub-board connected to an end of the flexible display via a flexible substrate and arranged between the shutter frame and the middle frame, a main board and a battery arranged in a back surface of the middle frame, and a back cover that covers the main board and the battery and is coupled to the back surface of the middle frame, wherein the middle frame includes a front mounting portion protruding in a backward direction at a location corresponding to the sub-board, a back mounting portion defined at a location corresponding to the main board and the battery, and a shielding side wall between the back mounting portion and the front mounting portion.

20 Claims, 8 Drawing Sheets

(56)                    References Cited

U.S. PATENT DOCUMENTS

| | | | |
|---|---|---|---|
| 2022/0137667 A1* | 5/2022 | Kim | G06F 1/1616 |
| | | | 361/679.21 |
| 2023/0087236 A1* | 3/2023 | Han | G06F 1/1681 |
| | | | 345/173 |
| 2023/0103852 A1* | 4/2023 | Na | H02J 50/80 |
| | | | 320/108 |

* cited by examiner

PORTABLE ELECTRONIC DEVICE

CROSS-REFERENCE TO RELATED APPLICATIONS

This application claims the benefit of Korean Patent Application No. 10-2022-0187774 filed in the Republic of Korea on Dec. 28, 2022, and Korean Patent Application No. 10-2023-0091994 filed in the Republic of Korea on Jul. 14, 2023, which are hereby incorporated by reference in their entirety as if fully set forth herein.

BACKGROUND OF THE INVENTION

1. Field of the Invention

The present disclosure related to a portable electronic device that reduces interference between components and improves durability with a dual frame structure.

2. Discussion of the Related Art

A portable electronic device is becoming commonplace in modern society because it may be easily carried by anyone and may be used freely anywhere, and types thereof are diversifying. The portable electronic device may include a portable computer, such as a laptop personal computer (PC), a palmtop PCs, a personal digital assistant (PDA), a mobile communication device (e.g., a mobile terminal or cellular phone), a game console, an audio player, a video player (e.g., an MP3 player and a portable media player (PMP)), and the like.

Such portable electronic devices may include a display device to provide visual information and/or various user interfaces. When a multimedia function is a main function, a size of a display may be maximized and a user input may be received using a keypad or an interface output (e.g., interactive elements, such as icons, prompts and the like) on the display. When an input function, such as a document creation function, is important, a separate user input device may be disposed to improve input convenience to a user.

As the portable electronic device diversifies in function and frequency of use thereof increases, a foldable electronic device, that is in a foldable form to expand an actual usable area size of a display of the foldable electronic device, with a limited size is widely used.

As a representative example, the portable computer referred to as a laptop may be mentioned, and in addition, an electronic device having the display on each of both sides (e.g., opposing sides) is also commercialized and used.

A form of the foldable electronic device can include two bodies and can be folded when carried and unfolded during use and can be classified into a foldable or clamshell form, and can have a hinge between the two bodies, such that an angle of the two bodies may be freely adjusted (e.g., by a user).

In particular, recently, a display device using organic light-emitting diodes (OLED) may be used to reduce the thickness while allowing for increased size of the display screen, and furthermore, an electronic device with a foldable display may be provided.

However, the display device including the large screen display does not have enough space for other components to be mounted, and as the display device becomes thinner, it is difficult to secure rigidity.

SUMMARY OF THE DISCLOSURE

The present disclosure is directed to providing a portable electronic device that reduces interference between components of the portable electronic device and improves durability with a dual frame structure.

Provided is a portable electronic device including a display, a shutter frame located on a back surface of the display, a middle frame located on a back surface of the shutter frame, a sub-board connected to an end of the display via a flexible substrate and located between the shutter frame and the middle frame, a main board and a battery located in a back surface of the middle frame, and a back cover that covers the main board and the battery and is coupled to the back surface of the middle frame, wherein the middle frame includes a front mounting portion protruding in a backward direction at a location corresponding to the sub-board, a back mounting portion defined at a location corresponding to the main board and the battery, and a shielding side wall between the back mounting portion and the front mounting portion.

The front mounting portion may include a connection hole exposing a connector of the sub-board.

The sub-board may include at least one of a display panel that controls an image displayed on the display and a touch panel that senses a touch input on the display.

The front mounting portion may include a first front mounting portion where the sub-board is located, and a second front mounting portion where the flexible substrate is located, and the portable electronic device may include a wireless charging board located on a back surface of the second front mounting portion.

A thickness of the flexible substrate may be smaller than a thickness of the sub-board, and the portable electronic device may include a step located between the first front mounting portion and the second front mounting portion.

The display may include a flexible display including a foldable portion bendable in a first direction while changing a curvature thereof, the middle frame may include a first middle frame and a second middle frame arranged on both sides around the foldable portion and connected to each other via a hinge module, and The main board may be located in a back mounting portion of the first middle frame, and the battery may be located in a back mounting portion of the second middle frame.

The sub-board may include a touch panel that is located in a front mounting portion of the first middle frame and senses a touch input of the display, and a display panel that is located in a front mounting portion of the second middle frame and controls an image output on the flexible display.

A flexible substrate that connects the display panel and the flexible display to each other may include an antenna substrate located on a back surface of the second middle frame located on the front.

The shutter frame may be divided at a boundary between the first middle frame and the second middle frame, and the shutter frame may be attached to the flexible display excluding the foldable portion and may be spaced apart from the foldable portion when the flexible display bends.

The flexible substrate and the sub-board may be attached to the back surface of the shutter frame via an adhesive tape.

According to at least one embodiment of the present disclosure, there is no noise interference between the touch panel and the main board, thereby improving the performance and eliminating the shield can.

The physical and electrical interference between the display components and the wireless charging-related components may be fundamentally blocked.

The rigidity may be improved because the long extending opening for passing the flexible substrate connected to the display panel therethrough may be omitted in the middle frame.

The impact applied in the lateral direction of the display device is not transmitted to the flexible substrate for connecting the display panel or the touch panel, thereby ensuring the durability of the flexible substrate.

Further scope of applicability of the invention will become apparent from the detailed description given hereinafter. However, it should be understood that the detailed description and specific examples, while indicating embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

FIGS. 3 and 4 are perspective views showing an open state of a portable electronic device according to one aspect of the present disclosure.

FIG. 7 is a cross-sectional view showing a conventional portable electronic device.

DETAILED DESCRIPTION OF THE EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "comprise," "including," "include," and "including" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, and the like.

Figure 1:
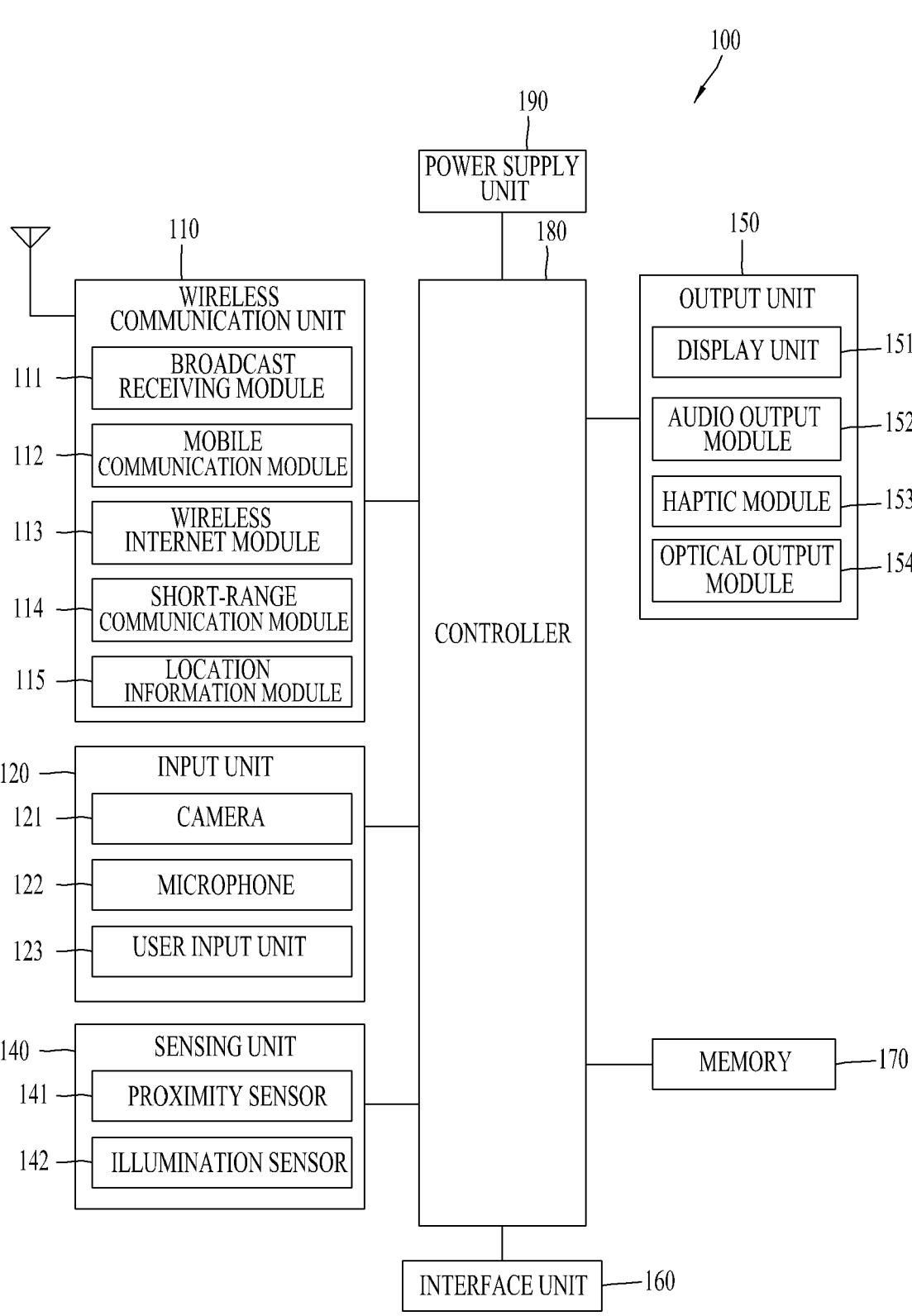
FIG. 1 is a block diagram of a portable electronic device in accordance with the present disclosure.

FIG. 1 is a block diagram of a portable electronic device in accordance with the present disclosure.

The portable electronic device 100 is shown having components, such as a wireless communication unit 110, an input unit 120, a sensing unit 140, an output unit 150, an interface unit 160, a memory 170, a controller 180 (e.g., hardware-embedded processor), and a power supply unit 190. It is understood that implementing all of the illustrated components in FIG. 1 is not a requirement, and that greater or fewer components may alternatively be implemented than the components listed above.

More specifically, the wireless communication unit 110 typically includes one or more modules which permit communications, such as wireless communications, between the portable electronic device 100 and a wireless communication system, communications between the portable electronic device 100 and another portable electronic device, communications between the portable electronic device 100 and an external server, or any other known communication means. Further, the wireless communication unit 110 typically includes one or more modules which connect the portable electronic device 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed as a user's control command.

The sensing unit 140 is typically implemented using one or more sensors configured to sense internal information of the portable electronic device, the surrounding environment of the portable electronic device, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The portable electronic device 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151 (e.g., display), an audio output module 152, a haptic module 153, and an optical output module 154. The display 151 may have an inter-layered structure or an integrated structure with a touch sensor in order to facilitate a touch screen. The touch screen may provide an output interface between the portable electronic device 100 and a user, as well as function as the user input unit 123 which provides an input interface between the portable electronic device 100 and the user.

The interface unit 160 serves as an interface with various types of external devices that can be coupled to the portable electronic device 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the portable electronic device 100 may perform assorted control functions associated with a connected external device, in response to the external device being connected to the interface unit 160.

The memory 170 is typically implemented to store data to support various functions or features of the portable electronic device 100. For instance, the memory 170 may be configured to store application programs executed in the portable electronic device 100, data or instructions for operations of the portable electronic device 100, and the like. Some of these application programs may be downloaded from an external server via wireless communication (e.g., as described above with respect to the wireless communication unit 110). Other application programs may be installed within the portable electronic device 100 at time of manufacturing or shipping, which is typically the case for basic functions of the portable electronic device 100 (for example, receiving a call, placing a call, receiving a message, sending a message, and the like). It is common for application programs to be stored in the memory 170, installed in the portable electronic device 100, and executed by the controller 180 to perform an operation (or function) for the portable electronic device 100.

The controller 180 typically functions to control overall operation of the portable electronic device 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above with reference to FIG. 1. Moreover, the controller 180 may be implemented to combinedly operate two or more of the components provided in the portable electronic device 100 to drive the application programs.

The power supply unit 190 can be configured to receive external power (e.g., AC or DC power) or provide internal power in order to supply appropriate power required for operating elements and components included in the portable electronic device 100. The power supply unit 190 may include a battery, and the battery may be embedded in the terminal body, separate from the terminal body or detachably attached to the terminal body (e.g., capable of being removed and/or replaced).

Some or more of the components may be operated cooperatively to embody an operation, control or a control method of the portable electronic device in accordance with embodiments of the present disclosure. Also, the operation, control or control method of the portable electronic device may be realized on the portable electronic device by driving of one or more application problems stored in the memory 170.

Figure 2:
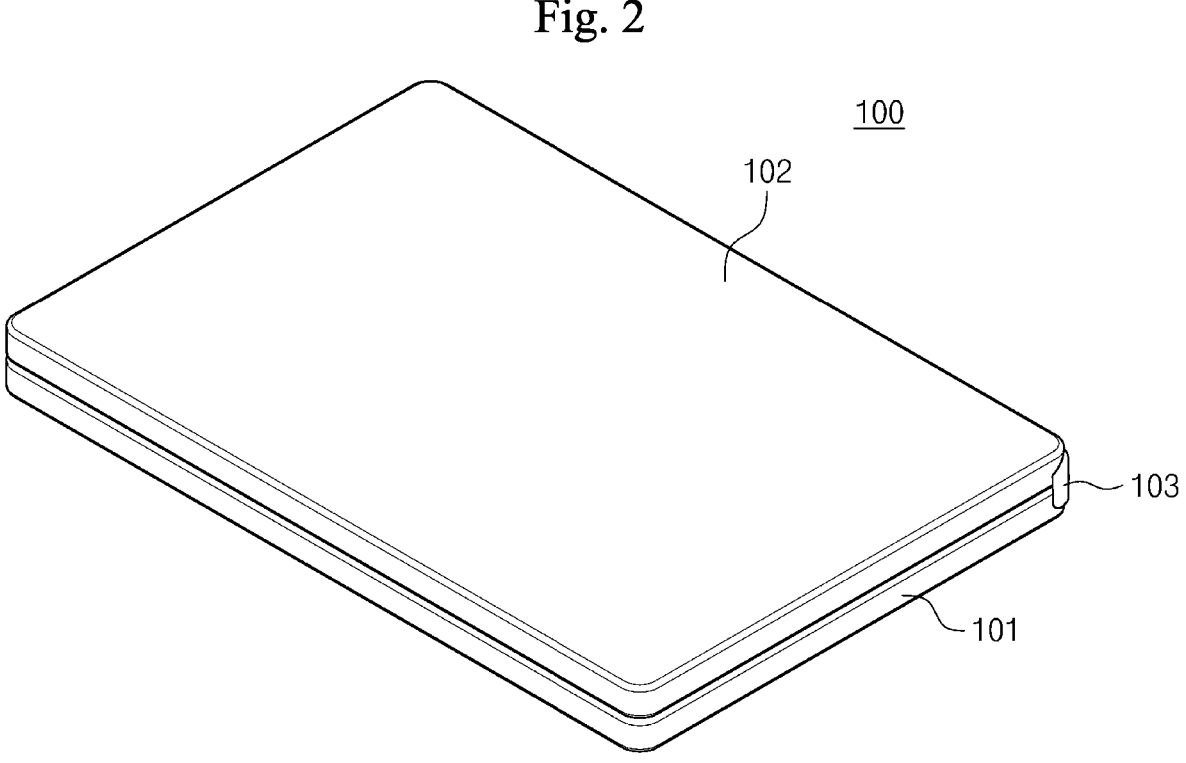
FIG. 2 is a perspective view showing a closed state of a portable electronic device according to one aspect of the present disclosure.
Figure 3:
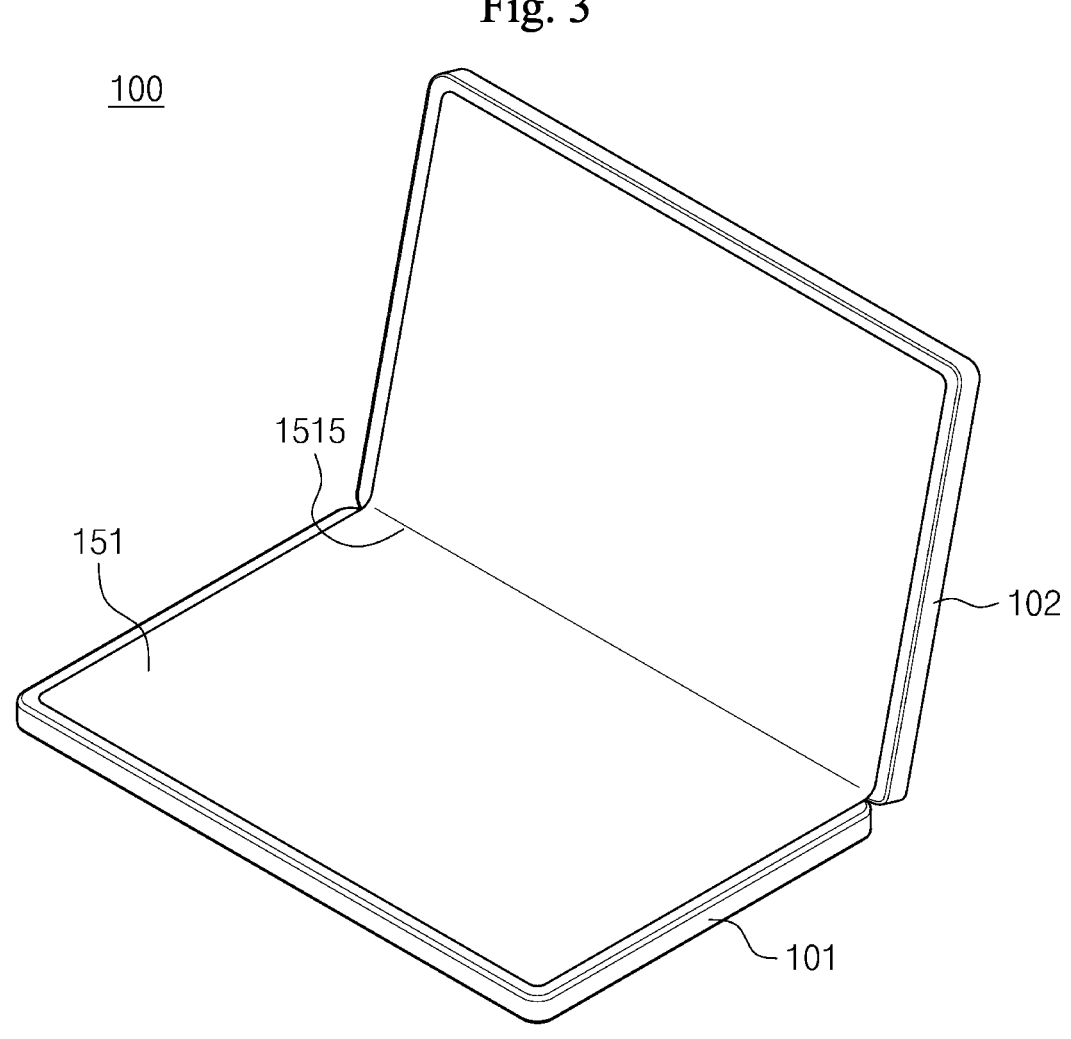
Figure 4:
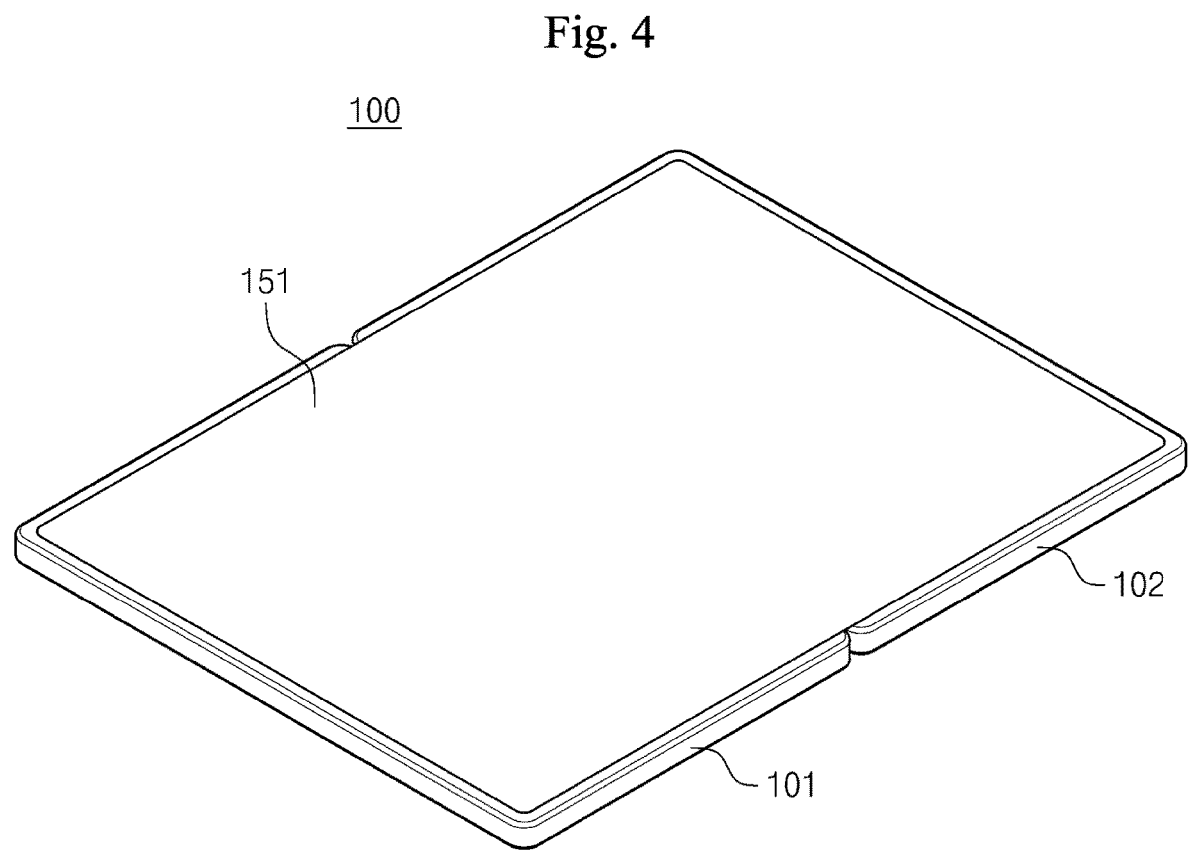

FIG. 2 is a perspective view showing a closed state of the portable electronic device 100 according to one aspect of the present disclosure, and FIGS. 3 and 4 are perspective views showing an open state of the portable electronic device 100 shown in FIG. 2.

The portable electronic device 100 according to the present disclosure includes a pair of bodies (a first body 101 and a second body 102). Additionally, the portable electronic device 100 includes a connecting portion 130 (see FIG. 7) that connects the first body 101 and the second body 102 to each other such that an angle between the first body 101 and the second body 102 may be varied. Additionally, the portable electronic device 100 may include the display 151 that covers respective surfaces on one side of the pair of bodies 101 and 102 and outputs an image.

The portable electronic device 100 according to the present disclosure is composed of the pair of bodies 101 and 102, and the first body 101 and the second body 102 are coupled to pivot via the connecting portion 130 including a hinge module 230. A hinge module composed of a pair of hinge axes such that the pair of bodies maintains the angle therebetween while operating symmetrically may be used as the hinge module 230.

The hinge module 230 can vary the angle between the first body 101 and the second body 102 and the first body 101 and the second body 102 can spread to form a predetermined angle between the first body 101 and the second body 102 as shown in FIGS. 3 and 4, thereby switching from a closed state in which the second body 102 is disposed to overlap one surface of the first body 101 as shown in FIG. 2 to an open state. FIG. 4 shows a fully open state to achieve 180° rotation, and FIG. 3 shows a partially open state with about 100° rotation.

When being carried, the device may be used in the closed state as shown in FIG. 2, and when in use, the second body 102 may be disposed slightly tilted backward from a vertical direction as shown in FIG. 3, so that a portion of the display 151 located on one surface of the second body 102 is disposed perpendicular to a line of sight of a user.

The display 151 that covers the respective surfaces of the first body 101 and the second body 102 on one side may be made of a flexible material such as organic light-emitting diodes (OLED) or the flexible display 151. The display 151 is made of the flexible material, and thus, is able to be folded as a foldable portion 1515 is bent in the closed state as shown in FIG. 2. The foldable portion 1515 may be curved with a predetermined curvature, and the connecting portion 130 may provide a predetermined space where the curved display 151 may be located.

In the state shown in FIG. 3, the portion of the display 151 located on the second body 102 may be used as a monitor as the output unit, and a portion of the display 151 located on the first body 101 may be used as a touchpad or a keyboard. Alternatively, a separate keyboard may be used and the device may be used in a form similar to a typical laptop.

Alternatively, as shown in FIG. 4, the first body 101 and the second body 102 may be opened to rotate 180°, so that the device may be used in a tablet-like form or as a large-screen monitor (e.g., dual screen or single large screen on two displays). The display 151 according to the present disclosure may not only be flexible, but may also include a touch electrode to enable touch input.

Figure 5:
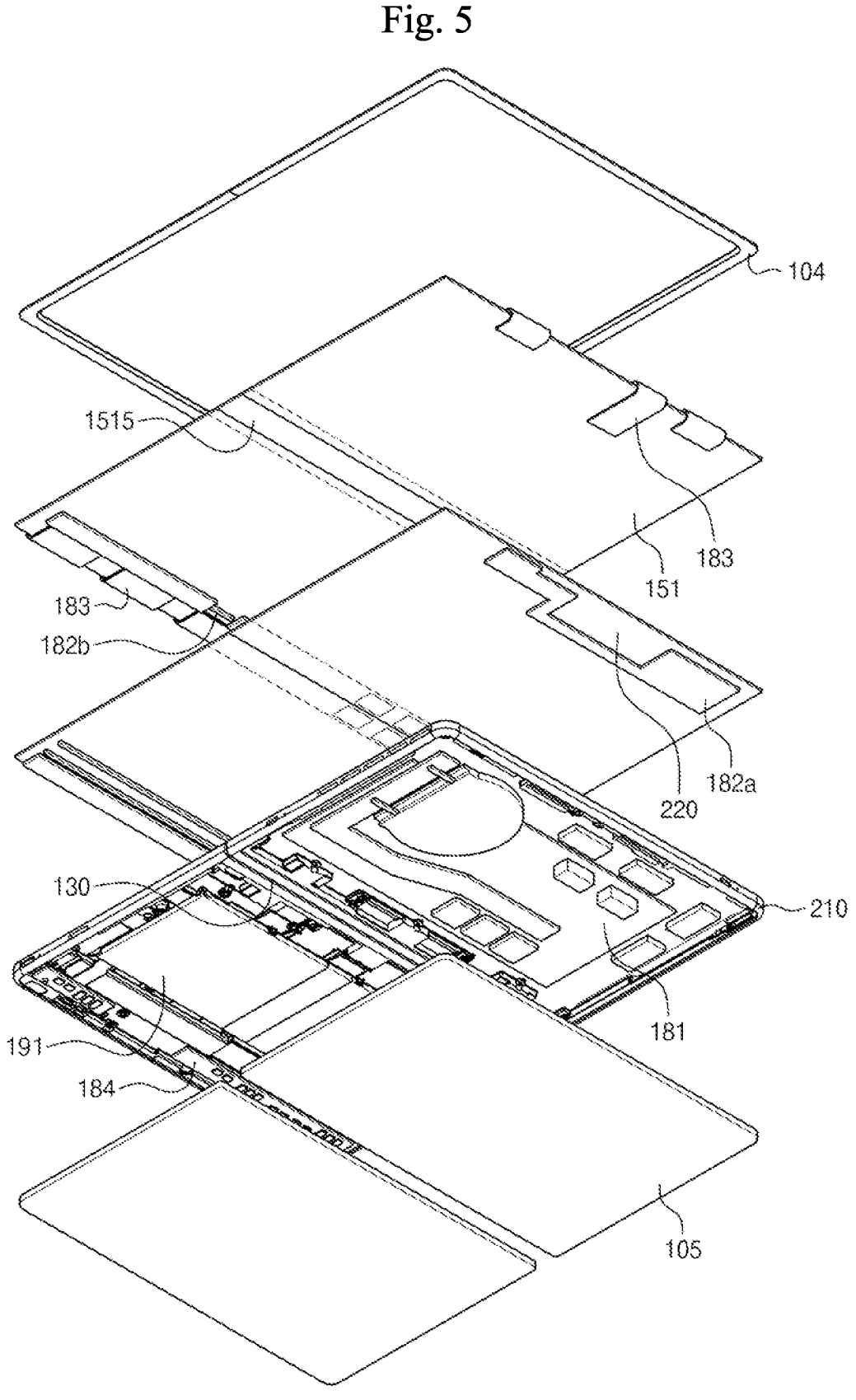
FIG. 5 is an exploded perspective view of a portable electronic device according to one aspect of the present disclosure.

FIG. 5 is an exploded perspective view of a portable electronic device according to one aspect of the present disclosure. The portable electronic device 100 according to the present disclosure may include the flexible display 151, a bezel decor 104 supporting a front surface perimeter of the flexible display 151, a shutter frame 220 located on a back surface of the display 151, a middle frame 210 on which a main board 181 (e.g., main circuit board) and a battery 191 are seated, and a back cover that covers electrical components of the middle frame 210.

The flexible display 151 may have a size that simultaneously covers the first body 101 and the second body 102, and may include the flexible organic light-emitting diodes (OLED). An inner plate, a thin metal plate, may be added to the back surface of the display 151 for rigidity. The inner plate is thin enough to be bendable and has a certain level of rigidity, thereby supporting a back surface of the organic light-emitting diodes.

The flexible display 151 may include a fixed portion fixed to the middle frame 210 and the foldable portion 1515 bendable to change a curvature thereof (e.g., in a first direction). Even though the entire flexible display 151 is composed of the bendable organic light-emitting diodes, a radius of curvature of the bendable foldable portion is increased by the inner plate attached to the back surface.

To reduce the radius of curvature, that is, to increase the curvature, of the foldable portion, the inner plate may include a plurality of slits extending in a second direction perpendicular to the first direction in an area corresponding to the foldable portion 1515. The plurality of slits may be arranged consecutively in the second direction, and slits adjacent to each other in the first direction may be arranged in a zigzag manner such that ends thereof are misaligned with each other.

The display 151 may have transparent electrodes arranged in a grid, and may include a display panel 182*b* to apply a signal for outputting an image to the transparent electrodes. The display panel 182*b* may connect the main board and the flexible display 151 to each other to apply power to the transparent electrodes of the display 151 in response to an image signal provided from the main board 181.

As shown in FIG. 5, the display 151 may be connected to the main board 181 at an end thereof in the first direction via a flexible substrate 183. The flexible substrate 183 is made of a bendable film material. The flexible substrate 183 may be bent to place the display panel 182*b* on the back surface of the display 151, and then the display panel 182*b* may be connected to the main substrate 181.

The flexible display 151 may further include a touch sensor to enable the touch input. A touch panel 182*a* may further be configured to (e.g., designed to) transmit the input sensed by the touch sensor to the main board 181. To avoid overlapping arrangement with the display panel 182*b*, the touch sensor may be located at the other end in the first direction of the display 151 opposite to the side where the display panel 182*b* is located.

The display panel 182*b* and the touch panel 182*a* are components that are connected to the flexible display 151 and are hereinafter referred to as a sub-board 182. In the drawing, the touch panel 182*a* is shown as being located in the first body 101 where the main board 181 is mounted, and the display panel 182*b* is shown as being located in the second body 102 where the battery 191 is mounted, but the locations thereof may be interchanged.

The middle frame 210 located on the back surface of display 151 may be divided into a first middle frame 210*a* and a second middle frame 210*b* to form the first body 101 and the second body 102 described above, respectively. The middle frame 210 may include a back mounting portion 211 that has rigidity and is a space in a back surface where components such as the main board 181 and the battery 191 may be seated.

A back cover 105 that is coupled to the back surface of the middle frame 210 and covers the components mounted in the middle frame 210. The back cover 105 forms an outer appearance of the display 151 device in a first state in which the portable electronic device 100 is closed.

The portable electronic device 100 according to the present disclosure may further include the shutter frame 220 between the flexible display 151 and the middle frame 210. The shutter frame 220 is a plate-shaped member that is thinner than the middle frame 210, and is able to be coupled to the back surface of the display unit 151.

The shutter frame 220 may also be divided into two, corresponding to a portion where a first frame and a second frame are separated from each other. Because the shutter frame 220 is thin but has rigidity, the shutter frame 220 may be coupled to the back surface of the display 151, excluding the foldable portion, and may be separated from the foldable portion when the foldable portion 1515 of the flexible display 151 is bent.

The conventional portable electronic device 100 did not have the shutter frame 220, so that all components had to be mounted on the back surface of the middle frame 210.

Figure 6:
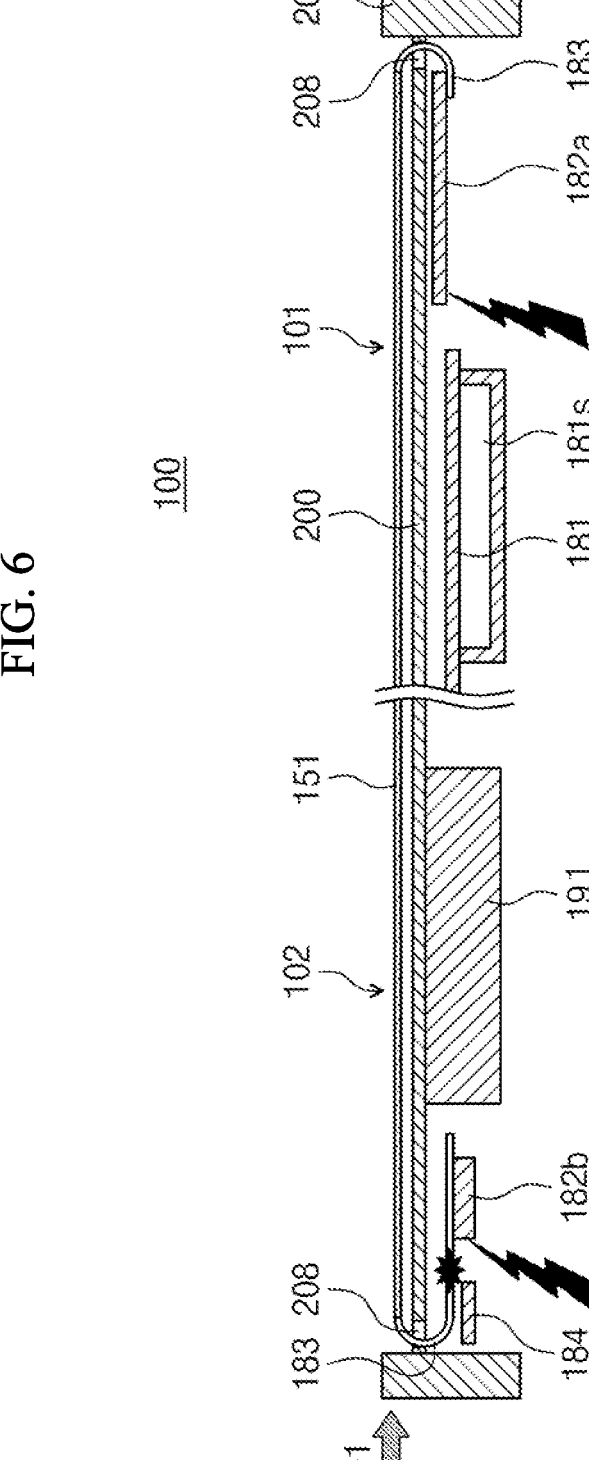
FIG. 6 is a diagram showing a middle frame of a portable electronic device according to one aspect of the present disclosure.

FIG. 6 is a cross-sectional view of the conventional portable electronic device 100. In the drawing, an upper side is a front surface and a lower side is a back surface. The flexible display 151 may be located on a front surface of the middle frame 210, and the flexible substrate 183 connected to the end of the flexible display 151 may pass through an opening 208 defined in the middle frame 210 and be connected to the display panel 182*b* and the touch panel 182*a* seated in the back surface of the middle frame 210.

For the display panel 182*b* to pass through the middle frame 210 and be disposed in the back surface of the middle frame 210, the middle frame 210 may include the opening 208 extending long in the second direction. The opening 208 extending long in the second direction reduces the rigidity of the middle frame 210. In particular, the device becomes vulnerable to an impact applied to a side surface 207 thereof in the first direction, so that the flexible substrate 183 connected to the display panel 182*b* may be damaged.

In addition, the touch panel 182*a*, which is the sub-board 182 disposed adjacent to the main board 181, may electrically interfere with the main board 181. The main board 181 may be further equipped with a shield can 181s to avoid an influence of the touch panel 182a.

The shield can 181s is a metal plate structure mounted on the main board 181 to prevent an integrated circuit (IC) or the like mounted on the main board 181 from being degraded in a performance or damaged by an influence of an external electromagnetic wave. That is, the shield can be an electromagnetic shield. The shield can 181s may be disposed at a predetermined distance apart from the IC or the like mounted on the main board 181 to avoid direct contact therewith. For the shield can 181s to be disposed away from the back cover, a body thereof becomes thicker.

In addition, in addition to the main board 181, a wireless charging board 184, a wireless communication board, or the like mounted in a back surface of the second frame may be further included, and such components that form an electromagnetic field may be influenced by peripheral devices.

The wireless charging board 184 mounted in the back surface of the second frame in FIG. 6 may be disposed adjacent to the display panel 182b, and the display panel 182b may malfunction by an influence of the electromagnetic field formed by the wireless charging board 184 or a wireless charging performance of the wireless charging board 184 may deteriorate by an influence of the display panel 182b.

To avoid such physical and electrical interference between the boards mounted in the back surface of the middle frame 210, the present disclosure constructs a double support structure of the portable electronic device 100 with the shutter frame 220 and the middle frame 210, and mounts the sub-board 182 in a front space of the middle frame 210.

Figure 7:
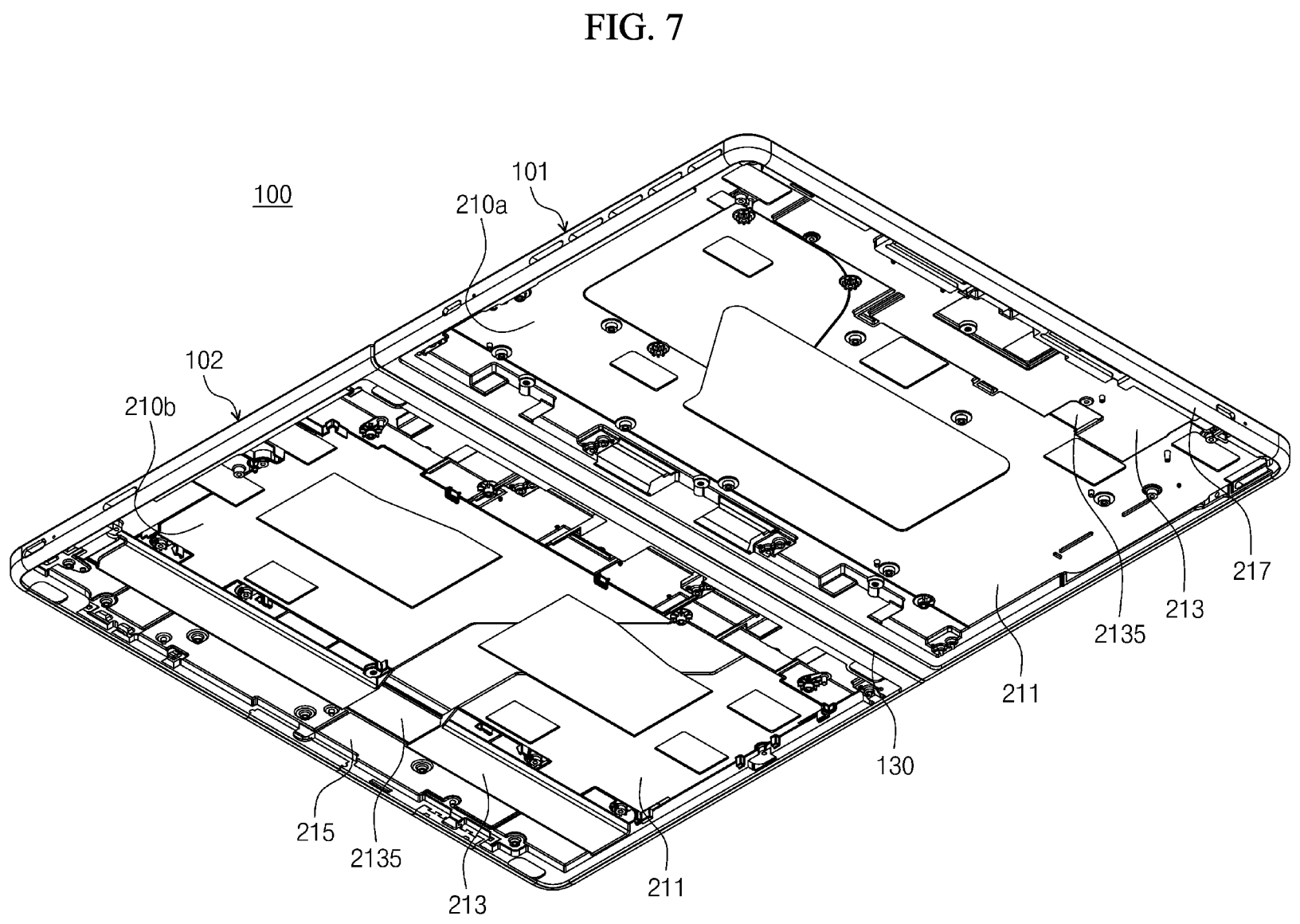
Figure 8:
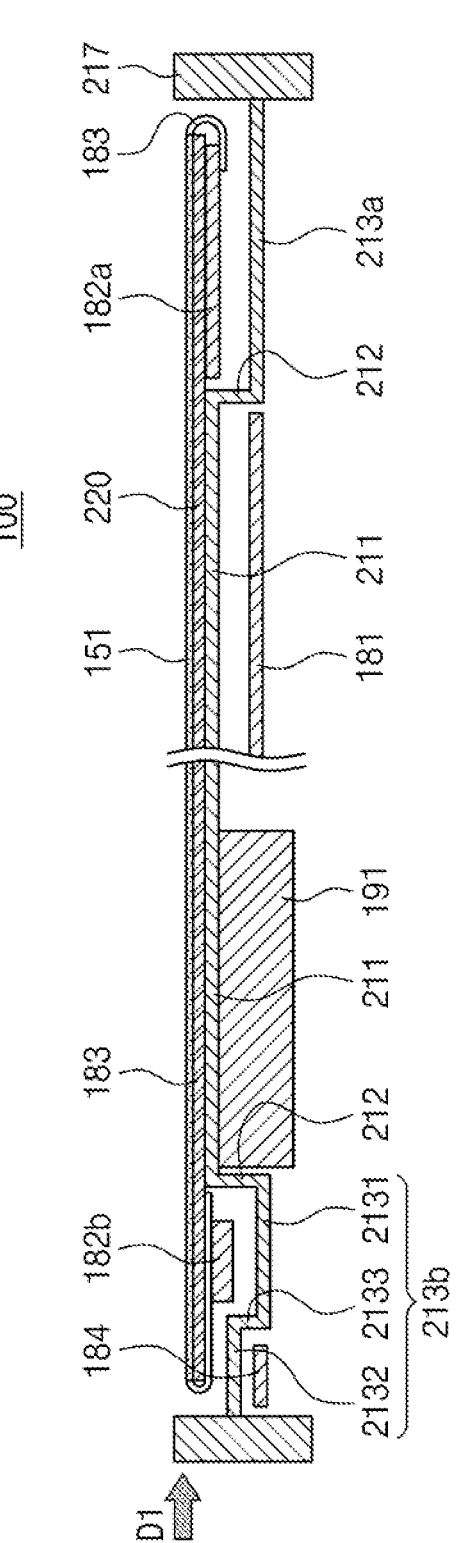
FIG. 8 is a cross-sectional view showing a portable electronic device according to one aspect of the present disclosure.

FIG. 7 is a diagram showing the middle frame 210 of the portable electronic device according to one aspect of the present disclosure, and FIG. 8 is a cross-sectional view showing the portable electronic device according to one aspect of the present disclosure.

The sub-boards 182a and 182b connected to the flexible display 151 via the flexible substrate 183 may be fixed to a back surface of the shutter frame 220 that is coupled to the back surface of the flexible display 151. The shutter frame 220 may be attached to the back surface of the flexible display 151, the flexible substrate 183 for connecting the sub-board 182 may be bent to fix the sub-board 182 to the back surface of the shutter frame 220 with an adhesive tape.

In the present disclosure, the sub-board 182 connected to the flexible display 151 may be coupled to the front surface of the middle frame 210 while being fixed to the back surface of the shutter frame 220. As the sub-board connected to the flexible display 151 does not need to be extended toward the back surface of the middle frame 210 and fixed to the back surface of the middle frame 210, an assembly process is simplified and disassembly for repair becomes easy.

An area on the back surface of the shutter frame 220 where the sub-board 182 is located may protrude in the backward direction, and the middle frame 210 may include a front mounting portion 213 that protrudes in the backward direction to provide a space for the sub-board 182 to be located in the front surface thereof.

A connection hole 2135 may be defined in the front mounting portion 213 for a cable that connects the sub-board 182 mounted in the front mounting portion 213 with the main board 181 mounted in the back mounting portion 211.

Because a predetermined level of rigidity may be secured with the shutter frame 220, the front surface of the middle frame 210 may define the space partially retracted in the backward direction, that is, the front mounting portion 213.

The middle frame 210 may include the back mounting portion 211 to mount the main board 181 and the battery 191 in the back surface thereof. The back mounting portion 211 and the front mounting portion 213 may be arranged adjacent to each other in a lateral direction of the middle frame 210 without overlapping each other.

The back mounting portion 211 provides the space in the direction of the back surface of the middle frame 210 and the front mounting portion 213 provides the space in the direction of the front surface of the middle frame 210, so that a shielding side wall 212 that forms a step between the front mounting portion 213 and the back mounting portion 211 may be formed.

The shielding side wall 212 may physically separate the front mounting portion 213 and the back mounting portion 211 from each other, and at the same time, electrically isolate the components mounted in the front mounting portion 213 and the back mounting portion 211 because the middle frame 210 is made of a metal material.

For example, referring to FIG. 8, electrical interference may be avoided between the main board 181 mounted in the back mounting portion 211 of the first middle frame 210a and the touch panel 182a mounted in the front mounting portion 213a because of the shielding side wall 212. The shield 181s can added onto the main board 181 of the conventional design shown in FIG. 6 is able to be eliminated, and a shielding performance is superior.

In one example, the wireless charging board 184 described above may be located at an end of the second middle frame 210b in the first direction. The wireless charging board 184 is located at one side of the second middle frame 210b where the battery 191 is mounted, and thus, is easy to be connected to the battery 191.

The wireless charging board 184 must be located at an end of the portable electronic device 100 for wireless charging. As shown in FIG. 8, the wireless charging board 184 may be disposed overlapping the flexible substrate 183 of the display panel 182b.

The flexible substrate 183 that connects the display panel 182b and the flexible display 151 to each other is made of the film material and is thin, so that a space thinner in a thickness direction than a first front mounting portion 2131 where the display panel 182b is seated is required. Therefore, as shown in FIG. 8, a step 2133 may be formed between the first front mounting portion 2131 and a second front mounting portion 2132 where the flexible substrate 183 is located.

As such, a back surface of the second front mounting portion 2132 where the flexible substrate 183 is located is able to secure a predetermined space because of the step 2133, so that the wireless charging board 184 may be disposed to overlap the flexible substrate 183 on the back surface of the second front mounting portion 2132.

In addition, because the middle frame 210 is located between the display panel 182b and the wireless charging board 184, electrical interference may be prevented between the display panel 182b and the wireless charging board 184. According to at least one embodiment of the present disclosure, there is no noise interference between the touch panel 182a and the main board 181, thereby improving performance and eliminating the shield can.

The physical and electrical interference between the components of the display 151 and the wireless charging-related components may be fundamentally blocked.

The rigidity of the middle frame 210 may be improved because the long extending opening 208 (see FIG. 6) for passing the flexible substrate 183 connected to the display panel 182*b* therethrough may be omitted in the middle frame 210.

The impact applied in the lateral direction of the portable electronic device 100 is not transmitted to the flexible substrate 183 for connecting the display panel 182*b* or the touch panel 182*a*, thereby ensuring durability of the flexible substrate 183.

The above detailed description should not be construed as being limitative in all terms, but should be considered as being illustrative. The scope of the present invention should be determined by reasonable analysis of the accompanying claims, and all changes in the equivalent range of the present invention are included in the scope of the present invention.

Various embodiments described herein may be implemented in a computer-readable medium using, for example, software, hardware, or some combination thereof. For example, the embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, micro-processors, other electronic units designed to perform the functions described herein, or a selective combination thereof. In some cases, such embodiments are implemented by the controller. For Example, the controller is a hardware-embedded processor executing the appropriate algorithms (e.g., flowcharts) for performing the described functions and thus has sufficient structure. Also, the embodiments such as procedures and functions may be implemented together with separate software modules each of which performs at least one of functions and operations. The software codes can be implemented with a software application written in any suitable programming language. Also, the software codes can be stored in the memory and executed by the controller, thus making the controller a type of special purpose controller specifically configured to carry out the described functions and algorithms. Thus, the components shown in the drawings have sufficient structure to implement the appropriate algorithms for performing the described functions.

For a software implementation, the embodiments such as procedures and functions may be implemented together with separate software modules each of which performs at least one of functions and operations. The software codes can be implemented with a software application written in any suitable programming language. Also, the software codes may be stored in the memory and executed by the controller. Thus, the components shown in the drawings have sufficient structure to implement the appropriate algorithms for performing the described functions.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

What is claimed is:

1. A portable electronic device comprising:
a display;
a shutter frame arranged on a back surface of the display;

a middle frame arranged on a back surface of the shutter frame, the middle frame including a front mounting portion, a back mounting portion and a shielding side wall between the front mounting portion and the back mounting portion;
a sub-board arranged between the shutter frame and the front mounting portion of middle frame;
a flexible substrate connecting the sub-board to an end of the display;
a main board arranged on a back surface of the back mounting portion of the middle frame;
a battery arranged on a back surface of the middle frame; and
a back cover covering the main board and the battery, the back cover being coupled to the back surface of the middle frame,
wherein the front mounting portion protrudes in a backwards direction more than the back mounting portion, and
wherein the shielding side wall is positioned between the sub-board and the main board and is configured to electrically isolate the sub-board and the main board.

2. The portable electronic device of claim 1, wherein the front mounting portion includes a connection hole exposing a connector of the sub-board.

3. The portable electronic device of claim 2, wherein the sub-board includes at least one of a display panel and a touch panel, the display panel being configured to control an image displayed on the display, and the touch panel being configured to sense a touch input on the display.

4. The portable electronic device of claim 1, wherein the front mounting portion includes:
a first front mounting portion overlapping a portion of the sub-board; and
a second front mounting portion overlapping the flexible substrate, and
wherein the portable electronic device further includes a wireless charging board arranged on a back surface of the second front mounting portion.

5. The portable electronic device of claim 4, wherein a thickness of the flexible substrate is less than a thickness of the sub-board, and
wherein a step is formed between the first front mounting portion and the second front mounting portion.

6. The portable electronic device of claim 1, wherein the display is configured to bend in a first direction at a foldable portion of the display,
wherein the middle frame further includes:
a first middle frame arranged on a first side of the foldable portion; and
a second middle frame arranged on a second side of the foldable portion, and
wherein the portable electronic device further includes a hinge connecting the first middle frame to the second middle frame.

7. The portable electronic device of claim 6, wherein the main board is arranged on a back mounting portion of the first middle frame, and
wherein the battery is arranged on a back mounting portion of the second middle frame.

8. The portable electronic device of claim 6, wherein the sub-board includes:
a touch panel arranged on the first middle frame, the touch panel being configured to sense a touch input of the display; and

a display panel arranged on the second middle frame, the display panel being configured to control an image output on the display.

9. The portable electronic device of claim 8, wherein the flexible substrate is configured to connect the display panel and the display to each other.

10. The portable electronic device of claim 6, wherein the shutter frame is divided at a boundary between the first middle frame and the second middle frame, wherein the shutter frame is attached to the display excluding the foldable portion, and wherein the shutter frame is configured to be spaced apart from the foldable portion when the display bends.

11. The portable electronic device of claim 1, further comprising an adhesive tape attaching the flexible substrate and the sub-board to the back surface of the shutter frame.

12. A portable electronic device comprising:

a display;

a shutter frame coupled to a back surface of the display;

a middle frame coupled to a back surface of the shutter frame, the middle frame including:

a back mounting portion;

a front mounting portion protruding in a backwards direction more than the back mounting portion; and a shielding side wall forming a step between the front mounting portion and the back mounting portion;

a main board positioned on a back surface of the back mounting portion;

a battery positioned on the back surface of the back mounting portion;

a sub-board arranged between the shutter frame and a front surface of the front mounting portion of the middle frame;

a flexible substrate connecting the sub-board to the display; and a back cover coupled to a back surface of the middle frame, wherein the shielding side wall is positioned between the sub-board and the main board and is configured to electrically isolate the sub-board and the main board.

13. The portable electronic device of claim 12, further comprising a hinge, wherein the shutter frame and the middle frame include a first portion and a second portion, and

wherein the hinge is arranged between the first portion and the second portion of the shutter frame and the middle frame to allow the shutter frame and the middle frame to rotate.

14. The portable electronic device of claim 13, wherein the sub-board includes at least one of a display panel and a touch panel, the display panel being configured to control an image displayed on the display, and the touch panel being configured to sense a touch input on the display.

15. The portable electronic device of claim 13, wherein the sub-board includes:

a touch panel arranged on the middle frame, the touch panel being configured to sense a touch input of the display; and a display panel arranged on the middle frame, the display panel being configured to control an image output on the display.

16. The portable electronic device of claim 15, wherein the flexible substrate is configured to connect the display panel and the display to each other, and wherein the flexible substrate is configured to be bent.

17. The portable electronic device of claim 15, wherein the main board includes a shield, and wherein the shield is a metal plate structure and is configured to shield the main board from electromagnetic interference.

18. The portable electronic device of claim 16, wherein the display includes a touch sensor, wherein the touch panel is arranged opposite to a side where the display panel is arranged, and wherein the touch panel is configured to transmit an input sensed by the touch sensor to the main board.

19. The portable electronic device of claim 15, wherein the display panel is configured to apply power to the display in response to an image signal received from the main board.

20. The portable electronic device of claim 12, wherein the front mounting portion includes:

a first front mounting portion where the sub-board is arranged; and a second front mounting portion where the flexible substrate is arranged, and wherein the portable electronic device further includes a wireless charging board arranged on a back surface of the second front mounting portion.

* * * * *